United States Patent [19]

Aoshima et al.

[11] Patent Number: 4,866,372
[45] Date of Patent: Sep. 12, 1989

[54] VOLTAGE DETECTOR HAVING COMPENSATION FOR POLARIZATION CHANGE CAUSED BY SPONTANEOUS BIREFRINGENCE

[75] Inventors: Shinichiro Aoshima; Yutaka Tsuchiya; Hironori Takahashi, all of Shizuoka, Japan

[73] Assignee: Hamamatsu Photonics Kabushiki Kaisha, Shizuoka, Japan

[21] Appl. No.: 200,502

[22] Filed: May 31, 1988

[30] Foreign Application Priority Data

May 31, 1987 [JP] Japan ................................ 62-137055

[51] Int. Cl.$^4$ ...................... G01R 31/00; G01R 29/12
[52] U.S. Cl. ..................................... 324/96; 350/356; 356/368
[58] Field of Search ............. 324/96, 117 R; 350/356, 350/374, 376; 356/368; 250/227

[56] References Cited

U.S. PATENT DOCUMENTS

| | | | |
|---|---|---|---|
| 4,253,061 | 2/1981 | Ono et al. ................................ | 324/96 |
| 4,446,425 | 5/1984 | Valdmanis et al. ............... | 324/77 K |
| 4,603,293 | 7/1986 | Mourou et al. ........................ | 324/96 |
| 4,618,819 | 10/1986 | Mourou et al. ..................... | 324/77 K |

FOREIGN PATENT DOCUMENTS

| | | |
|---|---|---|
| 0197196 | 10/1986 | European Pat. Off. . |
| 3326555 | 2/1984 | Fed. Rep. of Germany . |
| 0146858 | 9/1983 | Japan ..................................... 324/96 |

OTHER PUBLICATIONS

Williamson, S. et al., "Picosecond Electro–Electron Optic Oscilloscope", PROC. CONF. PICOSECOND ELECTRON. OPTOELECTRON., pp. 58–61, (N.Y. Springer-Verlag), 1985.

Kolner, B. H. et al., "Electrooptic Sampling in GaAs Integrated Circuits", IEEE JOURNAL OF QUANTUM ELECTRONICS, vol. qe–22, pp. 79–93, Jan. 1987.

Nees, J. et al., "Noncontact Electro-Optic Sampling with a GaAs Injection Laser", ELECTRONICS LETTERS, vol. 22, No. 17, pp. 918–919, Aug. 1986.

Valdmanis, J. A. et al., "Electro–Optic Sampling: Testing Picosecond Electronics Part 1. Principles and Embodiments", LASER FOCUS/ELECTRO-OPTICS, pp. 84–96, Feb. 1986.

Valdmanis, J. A. et al., "Electro–Optic Sampling: Testing Picosecond Electronics, Part 2. Applications", LASER FOCUS/ELECTRO-OPTICS, pp. 96–106, Mar. 1986.

Valdmanis, J. A. et al., "Subpicosecond Electrical Sampling and Applications", PICOSECOND OPTOELECTRONIC DEVICES, pp. 249–270, 1984.

Kolner, B. H. et al., "Electro-Optic Sampling With Picosecond Resolution", ELECTRONICS LETTERS, vol. 19, No. 15, pp. 574–575, Jul. 1983.

Tsuchiya, Y., "Advances in Streak Camera Instrumentation for the Study of Biological and Physical Processes", IEEE JOURNAL OF QUANTUM ELECTRONICS, vol. qe–20, No. 12, pp. 1516–1528, Dec. 1984.

(List continued on next page.)

Primary Examiner—Ernest F. Karlsen
Attorney, Agent, or Firm—Finnegan, Henderson, Farabow, Garrett & Dunner

[57] ABSTRACT

A voltage detector detects a voltage developing in a selected area of an object such as an integrated circuit by utilizing an electro-optic material equipped in an optical probe. A change in refractive index of the first electro-optic material which is caused by the voltage in the object, is detected as a change of polarization of a light beam passing through the first electro-optic material. In order to compensating for a polarization change caused by the spontaneous birefringence, the first and second electro-optic materials made of the same material are disposed in such a manner that the first and second electro-optic materials and aligned along a light-traveling direction with their lengths in the light-traveling direction being substantially identical and with their optic axes being perpendicular to each other.

13 Claims, 4 Drawing Sheets

OTHER PUBLICATIONS

Valdmanis, J. A., "High-Speed Optical Electronics: The Picosecond Optical Oscilloscope", SOLID STATE TECHNOLOGY/TEST AND MEASUREMENT WORLD, pp. S40-S44, Nov. 1986.

Valdmanis, J. A. et al., "Subpicosecond Electrooptic Sampling: Principles and Aopplications", IEEE JOURNAL OF QUANTUM ELECTRONICS, vol. qe-22, No. 1, pp. 69-78, Jan. 1986.

Valdmanis, J. A. et al., "Picosecond Electrooptic Sampling System", APPL. PHYS. LETT., vol. 41, No. 3, pp. 211-212, Aug. 1982.

Valdmanis, J. A. et al., "Subpicosecond Electrical Sampling", IEEE JOURNAL OF QUANTUM ELECTRONICS, vol. qe-19, No. 4, pp. 664-667, Apr. 1983.

Takeuchi, Seiichi, "Light-Applying Voltage and Electric Field Sensor", PATENT ABSTRACTS OF JAPAN, vol. 6, No. 41, pp. (106), (191), Mar. 13, 1982.

VOLTAGE DETECTOR HAVING COMPENSATION FOR POLARIZATION CHANGE CAUSED BY SPONTANEOUS BIREFRINGENCE

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong need exists in the art for detecting such rapidly changing voltage with high precision without affecting the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by electron beams.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent Application No. 137317/1987 filed on May 30, 1987) that voltage be detected by making use of the polarization of a light beam that changes with the voltage developing in a selected area of an object to be measured.

A voltage detector operating on this principle is schematically shown in FIG. 6. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 via a condenser lens 60; an optical fiber 92 for guiding reference light from the optical probe 52 into a photoelectric converter 55 via a collimator 90; an optical fiber 93 for guiding output light from the optical probe 52 into a photoelectric converter 58 via a collimator 91; and a comparator circuit 61 for comparing the electric signals form the photoelectric converters 55 and 58.

The optical probe 52 is filled with an electro-optic material 62 such as an optically uniaxial crystal of lithium tantalate (LiTaO$_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 6 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The beam is polarized by the polarizer 54 and a predetermined polarized component having intensity I is launched into the electro-optic material 62 in the optical probe 52 via the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as the state of polarization of input light launched into that material will change in proportion to the difference between refractive indices for an ordinary ray and an extraordinary ray and to the length 2l as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4)\sin^2[(\lambda/2)V-/V_o]$ in the analyzer 57 before it is further fed into the photoelectric converter 58. In the formula expressing the intensity of output light emerging from the analyzer 57, V is the voltage developing in the object to be measured, and $V_O$ is a half-wave voltage.

In the comparator circuit 61, the intensity of reference light produced from the photoelectric converter 55, or I/2, is compared with the intensity of output light produced from the other photoelectric converter 58, or $(I/4)\sin^2[(\lambda/2)V/V_o]$.

The intensity of output light, or $(I/4)\sin^2[(\pi/2)V-/V_O]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 6, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions. If desired, a pulse light source such as a laser diode that produces light pulses of a very narrow pulse width may be used as a light source to ensure that rapid changes in the voltage on the object to be measured are sampled at extremely short time intervals. Rapid changes in the voltage on the object of interest can be measured with a very high time resolution by using a CW light source and a quick-response detector such as a streak camera. Either method is capable of precision detection of rapid changes in voltage.

While various materials are used as electro-optic material 62 in the optical probe 52 for the voltage detector 50 shown in FIG. 6, most of them are birefringent under natural conditions. For example, an optically uniaxial crystal of lithium tantalate ($LiTaO_3$) produces a phase retardation on account of birefringence that occurs spontaneously in proportion to the difference between the refractive index for an ordinary ray $n_o$ and the refractive index for an extraordinary ray $n_e$. This phase retardation occurs even when no voltage is applied to an optically uniaxial crystal and the state of light polarization will change on account of this phase retardation. Therefore, if one wants to detect the voltage on an object of interest precisely by selectively extracting the change in light polarization that results from a change in refractive index upon voltage application, he has to employ a certain means for canceling the phase retardation caused by spontaneous birefringence.

In order to detect the voltage in a selected area of an object of interest with high sensitivity, it is also necessary to reject a dc component from the light emerging from the analyzer 57. Stated more specifically, if the voltage to be measured that develops in an area of interest is a rapidly changing voltage superposed on a dc voltage, one who wants to selectively detect the rapidly changing voltage component must eliminate the change in the state of light polarization that depends on the dc voltage.

FIG. 7 shows the light intensity I vs. voltage V profile for the case where the analyzer 57 into which the output light emerging from the electro-optic material 62 is introduced is disposed at right angle with respect to the polarizer 54. At operating point P1 on the curve shown in FIG. 7, the change in the intensity of output light, $\Delta I_1$, is linear to the change in voltage $V_1$. However, because of the presence of a dc component $I_{DC}$ in the intensity of output light I, the detector is unable to selectively detect the change in the intensity of output light $\Delta I_1$ with high sensitivity. It is therefore necessary to convert the intensity I of light output from the analyzer 57 in such a way that it will not contain any of the dc component $I_{DC}$ although the change in light intensity $\Delta I_2$ is not linear to the change in voltage $\Delta V_2$ as depicted by operating point P2 on the curve shown in FIG. 7.

To meet this need, a voltage detector having the construction shown in FIG. 8 and which is generally indicated by 70 was previously proposed by the present inventors.

The optical probe 17 for the voltage detector 70 shown in FIG. 8 differs from the probe 52 shown in FIG. 6 in that it has a phase compensator 16 between the beam splitter 56 and the electro-optic material 62. By properly adjusting this phase compensator 16, the change in the state of polarization of output light produced from the electro-optic material 62 can be reduced to such a level that it originates only from the voltage applied to the electro-optic material 62. In other words, in detecting the voltage in a selected area of an object to be measured, the phase compensator 16 may be adjusted in such a way that in the absence of any voltage applied to the electro-optic material 62, the polarized component of the output light produced from said material is directed perpendicular to that of input light (launched into that material), and with the least intensity of output light being produced from the analyzer 57. By adjusting the phase compensator 16 in this way, it becomes possible to cancel the change in the state of polarization of output light that is caused by the phase retardation due to the spontaneous birefringence occurring in the electro-optic material 62.

The phase compensator 16 used for this purpose may be a Soleil compensator capable of mechanical adjustment or a Babinet compensator which is suitable for the case where a small-diameter spot is produced by light beam. A Soleil compensator is equipped with a sliding adjustment mechanism that allows for adjustment from the outside of the optical probe 17. Before detection of the voltage in a selected area of an object to be measured, the adjustment mechanism is operated, usually manually, with no voltage applied to the electro-optic material 62, so as to eliminate the effect of phase retardation caused by spontaneous birefringence.

If the phase compensator 16 is of the voltage adjustable type, the dc component $I_{DC}$ can be rejected from the intensity of output light from the analyzer 57 by first applying a given voltage to the compensator 16 and then adjusting it manually in such a way that it will operate at point P2 on the curve shown in FIG. 7.

The problem is that the phase retardation caused by spontaneous birefringence occurring in the electro-optic material 62 is temperature-dependent and varies with the change in the temperature of the optical probe 17, or the environment in which the electro-optic material 62 is used. The intensity of output light at operating point P2 on the curve shown in FIG. 7 also varies with temperature change. It should particularly be mentioned that at operating point P2 the intensity of output light varies nonlinearly, so that a variation in the intensity of output light on account of temperature change can cause a significant effect on the precision of voltage detection. Therefore, even if the phase compensator 16 used in the voltage detector 70 shown in FIG. 8 is manually adjusted to a predetermined value prior to voltage detection, the initial setting will become no longer appropriate in the phase of subsequent changes in temperature and correct results cannot be attained over the entire period of voltage detection.

SUMMARY OF THE INVENTION

An object, therefore, of the present invention is to provide a voltage detector of simple structure that closely follows temperature changes so as to eliminate any adverse effects thereof and which is capable of detecting the voltage in a selected area of an object of interest at all times with high precision and sensitivity.

The present invention is basically intended as an improvement of a voltage detector of the type that employs an electro-optic material whose refractive index will change according to the voltage developing in a selected area of an object to be measured.

A voltage detector according to the first aspect of the present invention includes a first electro-optic material that is subject to the effect of the voltage developing in a selected area of an object to be measured and a second electro-optic material that is disposed in such a way as to compensate for the phase retardation caused by spontaneous birefringence occurring in the first electro-optic material. The second electro-optic material is made of the same material as the first electro-optic material and has the same length as the latter in the light-traveling direction with the two electro-optic materials aligned along the light-traveling direction.

A voltage detector according to the second aspect of the present invention further includes a first transparent electrode between the first and second electro-optic materials, as well as a second transparent electrode disposed on the side of the second electro-optic material which is opposite to the side where the first transparent electrode is disposed. The first transparent electrode is connected to a predetermined potential, say, the ground potential. A predetermined, preferably variable, voltage is applied to the second transparent electrode.

Other and further objects, features and advantages of the invention will appear more fully from the following description taken in connection with the accompanying drawings.

DETAILED DESCRIPTION OF THE PREFERRED EMBODIMENTS

Various embodiments of the present invention are described hereinafter with reference to the accompanying drawings.

Figure 1:
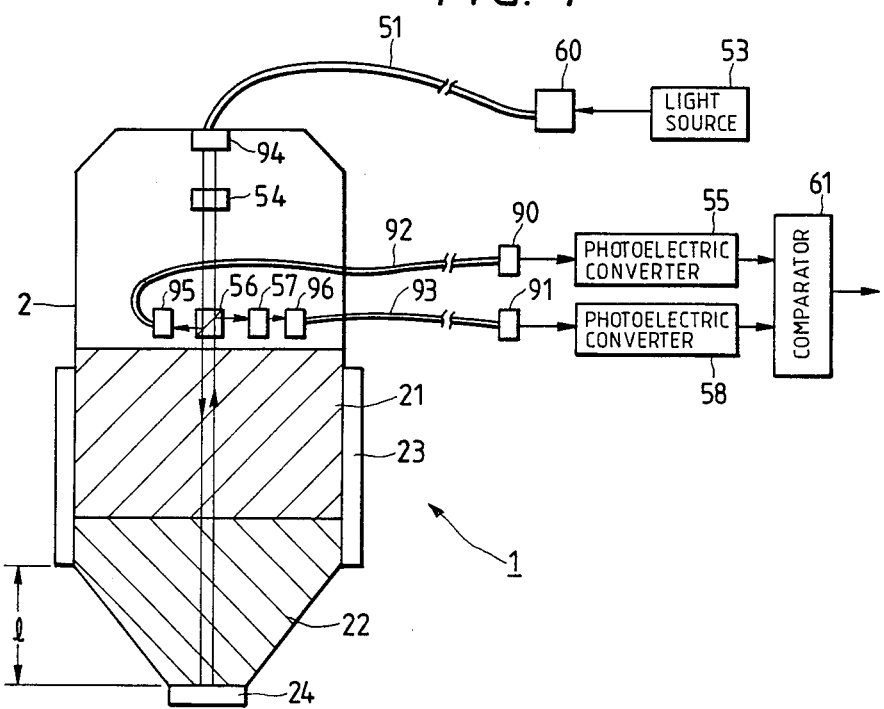
FIG. 1 is a diagram showing the composition of voltage detector according to an embodiment of the first aspect of the present invention.

FIG. 1 is a diagram showing the composition of a voltage detector according to one embodiment of the first aspect of the present invention. In FIG. 1, components which are the same as those shown in FIGS. 6 and 8 are identified by like numerals and redundant explanation is omitted.

Figure 6:
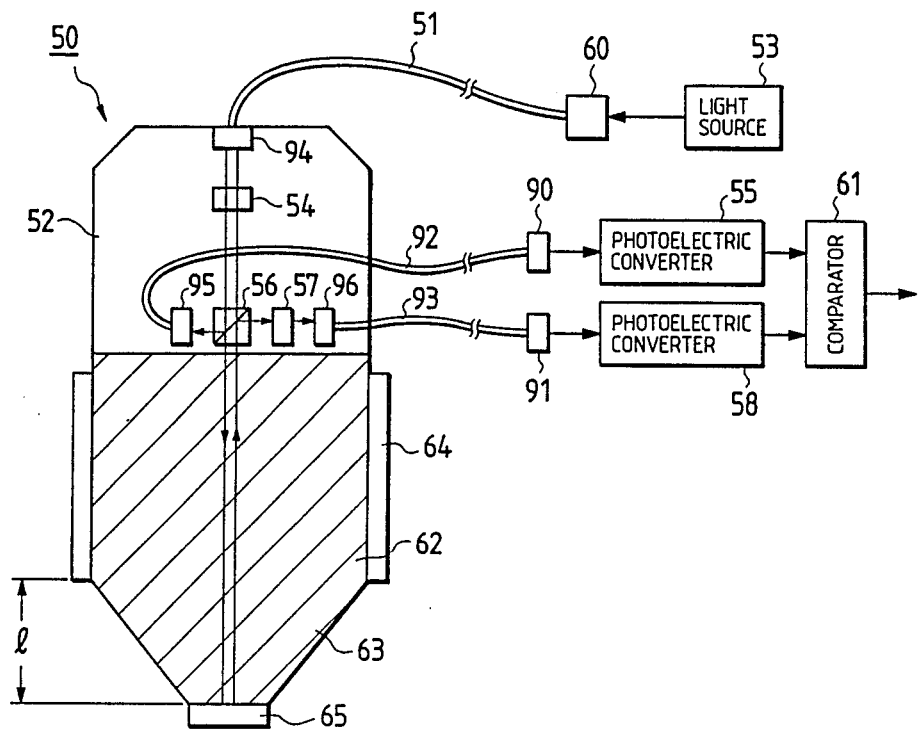
FIG. 6 is a diagram showing the composition of a voltage detector having been proposed in Japanese Patent Application No. 137317/1987.
Figure 8:
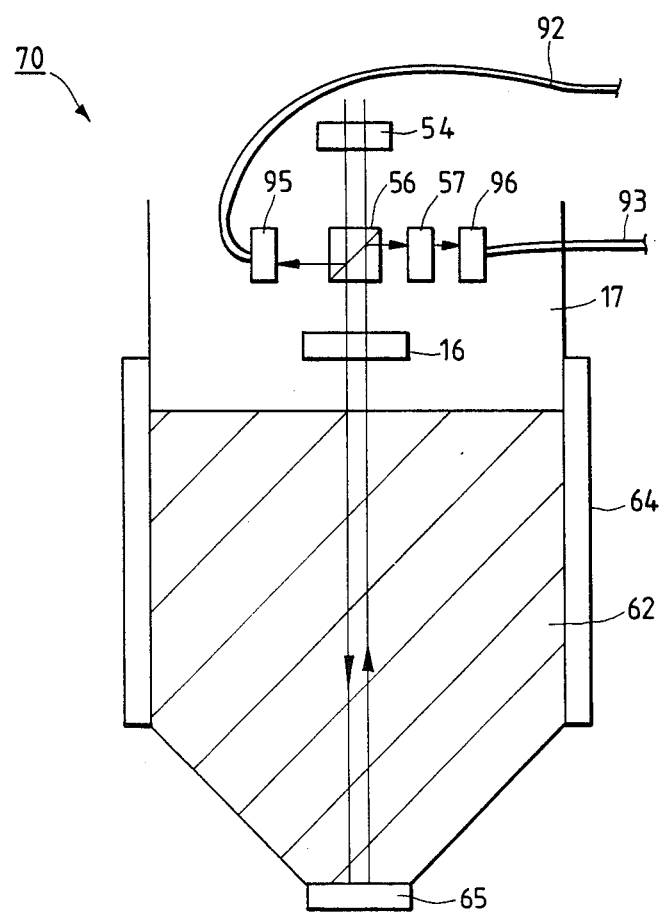
FIG. 8 is a diagram showing the composition of a voltage detector equipped with a phase compensating plate.

The voltage detector generally indicated by 1 in FIG. 1 has the following components installed in an optical probe 2 as in the optical probes 52 and 17 shown in FIGS. 6 and 8, respectively: a collimator 94; condenser lenses 95 and 96; a polarizer 54; a beam splitter 56; and an analyzer 57. Instead of the electro-optic material 62 in the optical probes 52 and 17 shown in FIGS. 6 and 8, two electro-optic materials 21 and 22 are packed in the optical probe 2 of the voltage detector 1. The two electro-optic materials 21 and 22 are made of entirely the same material (i.e., an optically uniaxial crystal) and have the same length in the light-traveling direction. In the embodiment shown in FIG. 1, the two electro-optic materials 21 and 22 are disposed in such a way that their optic axes are perpendicular to each other.

The electro-optic material 21 is surrounded completely, and the electro-optic material 22 is surrounded partly, with a conductive electrode 23. The electro-optic material 22 has at its tip a coating of reflecting mirror 24 in the form of a thin metal film or a multi-layered dielectric film. The conductive electrode 23 is connected to the ground potential. Since no electric field will be produced within the electro-optic material 21, its refractive index will not change according to the voltage developing in a selected area of an object being measured. Therefore, the state of polarization of a light beam traveling through the electro-optic material 21 will change solely on account of the phase retardation caused by spontaneous birefringence occurring in said material 21.

On the other hand, the refractive index of the electro-optic material 22 will change on account of the difference between the potential induced in the reflecting mirror 24 by the voltage in a selected area of the object being measured and the ground potential to which the conductive electrode 23 is connected. Therefore, the state of polarization of a light beam traveling through the electro-optic material 22 will change not only in response to the voltage in a selected area of the object being measured but also on account of the phase retardation caused by spontaneous birefringence occurring in the material 22.

As already mentioned, th optic axes of the electro-optic materials 21 and 22 are perpendicular to each other, so the change, due to spontaneous birefringence, of the state of polarization of the light beam passing through the electro-optic material 21 is in a direction opposite to that of the light beam passing through the electro-optic material 22.

In the voltage detector 1 having the construction described above, a light beam having a predetermined polarized component which is produced from the polarizer 54 as its output is passed through the beam splitter 56 and thence launched as input light into the electro-optic material 21. The launched light experiences a change in the state of its polarization on account of the phase retardation caused by spontaneous birefringence occurring in the electro-optic material 21, and is thereafter launched in the electro-optic material 22.

As already mentioned, the electro-optic materials 21 and 22 are of equal length in the light-traveling direction, so the input light, when launched into the electro-optic material 22, will experience a change in the state of its polarization on account of the phase retardation caused by spontaneous birefringence occurring in this material and the direction of this change is opposite to that in which the same phenomenon occurs in the electro-optic material 21. In addition, the state of polarization of the input light also change as a result of the change in refractive index occurring on account of the potential of the reflecting mirror 24. Therefore, when the input light reaches the reflecting mirror 24, the state of its polarization has changed in accordance with the change in the refractive index of the electro-optic material 22 that occurs on account of the voltage developing in a selected area of the object being measured, and the effect of the phase retardation due to spontaneous birefringence has been rejected from the change in the state of polarization of the input light.

When the light reflected from the reflecting mirror 24 travels back through the electro-optic materials 22 and 21 to emerge therefrom as output light, the change in the state of its polarization on account of the phase retardation caused by spontaneous birefringence is canceled by entirely the same mechanism as described above, and the output light when it emerges from the electro-optic material 21 has undergone a further change in the state of polarization in accordance with the change in the refractive index of the electro-optic material 22 that occurs on account of the voltage developing in a selected area of the object being measured. Therefore, the state of polarization of the output light (emerging from the electro-optic material 21) which is directed into the analyzer 57 has changed from the state of polarization of the input light that was produced by splitting with the beam splitter 56, and this change does not contain any of the effects of phase retardation that are caused by spontaneous birefringence occurring in the electro-optic materials.

As described above, in the embodiment shown in FIG. 1 according to the first aspect of the present invention, the electro-optic material 22 which is subject to the effect of the voltage occurring in a selected area of the object to be measured is disposed in such a way that its optic axis is perpendicular to that of the electro-optic material 21 which is made of entirely the same material as 22 and which is also equal in length to the latter in the light-traveling direction. In addition, the voltage detector 1 is so set up that no electric field will be produced in the electro-optic material 21. As a result, the change in the state of polarization of a light beam passing through the electro-optic material 22 on account of the phase retardation caused by spontaneous birefringence is canceled by the change in the state of light polarization on account of the phase retardation caused by spontaneous birefringence in the electro-optic material 21, and the state of polarization of output light to be directed into the analyzer 57 from the electro-optic material 21 can be changed from the state of polarization of input light by an amount solely dependent on the voltage applied to the electro-optic material 22.

The voltage detector 1 shown in FIG. 1 has the following advantages over the detector 70 shown in FIG. 8: first, it does not require any cumbersome step such as adjusting the phase compensator 16 prior to voltage detection; secondly, even if the environmental temperature changes, the phase retardation due to the spontaneous birefringence in the electro-optic material 21 changes in entirely the same way as the phase retardation due to the spontaneous birefringence in the electro-optic material 22, thereby canceling at all times the change in the state of light polarization due to the phase retardation caused by spontaneous birefringence.

Figure 2:
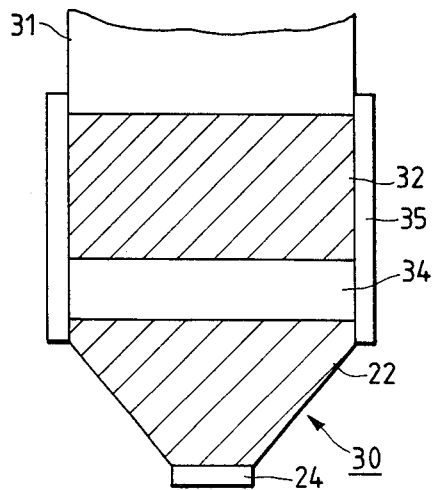
FIG. 2 is a diagram showing part of the composition of a voltage detector according to a modification of the concept shown in FIG. 1.

FIG. 2 shows a modification of the voltage detector 1 shown in FIG. 1. The voltage detector generally indicated by 30 in FIG. 2 contains two electro-optic materials 22 and 32 and a half-wavelength ($\lambda/2$) plate 34. The electro-optic material 32 is made of the same material (optically uniaxial crystal) as the electro-optic material 21 used in the voltage detector 1 shown in FIG. 1 and it has the same length as the electro-optic material 22 in the light-traveling direction. However, the electro-optic material 32 is disposed in such a way that its optic axis is parallel to that of the electro- 0 optic material 22. The $\lambda/2$ plate 34 is disposed between the two electro-optic materials 32 and 22 and has following two capabilities: changing the polarizing direction of input light from the electro-optic material 32 by 90° before it is launched into the electro-optic material 22; and in a like manner, changing the polarizing direction of output light from the electro-optic material 22 by 90° before it is launched into the electro-optic material 32. This change of polarizing direction of 90° is caused by the phase retardation of between an ordinary ray and an extraordinary ray in the $\lambda/2$ plate 34. In short, the voltage detector 30 shown in FIG. 2 differs from the detector 1 shown in FIG. 1 in that the $\lambda/2$ plate 34 is inserted between the electro-optic materials 32 and 22 instead of making their optic axes perpendicular to each other.

In the embodiment shown in FIG. 2, the electro-optic material 32 and the $\lambda/2$ plate 34 are surrounded entirely, and the electro-optic material 22 surrounded partly, with a conductive electrode 35. As in the voltage detector 1 shown in FIG. 1, the conductive electrode 35 is connected to the ground potential so that no electric field will be produced within the electro-optic material 32.

In the voltage detector 30 having the construction described above, input light launched into the electro-optic material 32 experiences a change in the state of its polarization on account of the phase retardation caused by spontaneous birefringence taking place in the electro-optic material 32. The light then enters the λ/2 plate 34 where its polarizing direction changes by 80° before it is launched into the electro-optic material 22. Since the λ/2 plate 34 changes the polarizing direction by 90°, the input light launched into the electro-optic material 22 will experience a change in the state of its polarization on account of the phase retardation due to spontaneous birefringence occurring in that material and the direction of this change is opposite to that of the change occurring in the electro-optic material 32. The light launched into the electro-optic material 22 will experience a further change in the state of its polarization on account of the change in refractive index caused by the voltage on the object being measured. Therefore, when the launched light reaches the reflecting mirror 24, the state of its polarization has changed in accordance with the change in the refractive index of the electro-optic material 22 that occurs on account of the voltage on the object of interest, and the resulting change in the state of polarization of the launched light does not contain any of the effects of the phase retardation due to spontaneous birefringence.

When the light reflected from the reflecting mirror 24 travels back through the electro-optic materials 22 and 32 to emerge therefrom, the change in the state of its polarization on account of the phase retardation caused by spontaneous birefringence is canceled by entirely the same mechanism as described above, and the light when it emerges from the electro-optic material 32 has undergone a further change in the state of polarization in accordance with the change in the refractive index of the electro-optic material 22 that occurs on account of the voltage on the object being measured. Therefore, the state of polarization of the output light which is directed into the analyzer 57 has changed from the state of polarization of the input light, and this change does not contain any of the effects of phase retardation that are caused by spontaneous birefringence occurring in the electro-optic materials.

As described above, the voltage detector 30 shown in FIG. 2 has the λ/2 plate 34 inserted between the electro-optic materials 32 and 22 which are disposed in such a way that their optic axis are parallel to each other. Since this plate changes the polarizing direction by 90°, the change in the state of polarization of a light beam passing through the electro-optic material 22 on account of the phase retardation caused by spontaneous birefringence can be canceled by the change in the state of light polarization on account of the phase retardation caused by spontaneous birefringence in the electro-optic material 32, and the state of polarization of output light to be directed into the analyzer 57 from the electro-optic material 32 can be changed from the state of polarization of reference light by an amount solely dependent on the voltage applied to the electro-optic material 22.

As in the embodiment shown in FIG. 1, the voltage detector 30 shown in FIG. 2 does not require any cumbersome pre-adjustments and the effects of phase retardation caused by birefringence occurring in the two electro-optic materials can be canceled at all times in spite of changes in the environmental temperature, thereby ensuring precise detection of the voltage in a selected area of the object being measured.

Figure 3:
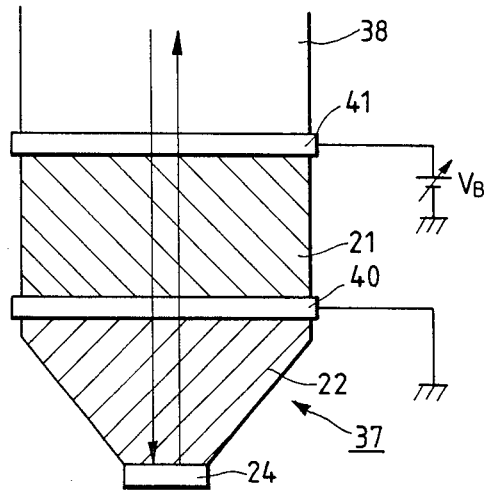
FIG. 3 is a diagram showing part of the composition of a voltage detector according to an embodiment of t second aspect of the present invention.

FIG. 3 is a diagram showing part of the composition of an embodiment according to the second aspect of the present invention. As in the voltage detector 1 shown in FIG. 1, the optical probe 38 of the voltage detector generally indicated by 37 in FIG. 3 contains two electro-optic materials 21 and 22 that are of equal length in the light-traveling direction and which are disposed in such a way that their optic axes are perpendicular to each other. In the embodiment shown in FIG. 3, the probe 38 further includes a transparent electrode 40 between the two electro-optic materials 21 and 22, as well as another transparent electrode 41 disposed on the side of the electro-optic material 21 which is opposite to the side where the transparent electrode 40 is disposed.

The transparent electrode 40 is designed to permit the launching of input light from the electro-optic material 21 into 22 while permitting the transmission of output light from electro-optic material 22 to 21. The transparent electrode 41 is designed to permit the launching of input light from beam splitter 56 into electro-optic material 21 while permitting the transmission of output light from electro-optic material 21 into beam splitter 56 and thence into analyzer 57. During use of the voltage detector 37, the transparent electrode 40 is connected to the ground potential while the transparent electrode 41 is supplied with a variable voltage $V_B$. In other words, the voltage detector 37 shown in FIG. 3 is designed in such a way that the refractive index of the electro-optic material 22 will vary in accordance with the potential difference between the voltage on the object being measured and the ground potential to which the transparent electrode 40 is connected, while the refractive index of the electro-optic material 21 will vary in accordance with the potential difference between the variable voltage $V_B$ applied to the transparent electrode 41 and the ground potential to which the transparent electrode 40 is connected. The transparent electrode 40 is disposed parallel to the reflecting mirror 24 so that the lines of electric force extending from the object of interest through the reflecting mirror 24 will run into the electro-optic material 22 parallel to its central axial line. As a result, a uniform change in refractive index will occur at all positions in the electro-optic material 22. In a like manner, the transparent electrode 41 is disposed parallel to the transparent electrode 40, so that the lines of electric force running into the electro-optic material 21 will extend parallel to its central axial line, thereby creating a uniform change in refractive index at all positions in the electro-optic material 21.

Figure 7:
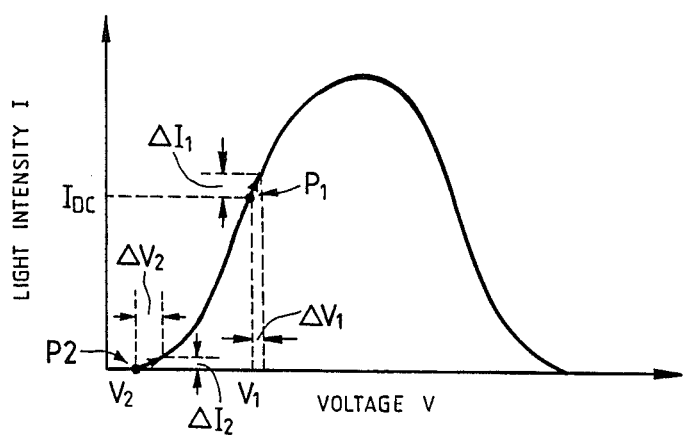
FIG. 7 is a graph showing the voltage dependency of the intensity of output light.

As in the voltage detector 1 shown in FIG. 1, the two electro-optic materials 21 and 22 in the voltage detector 37 shown in FIG. 3 are of equal length in the light-traveling direction and their optic axes are perpendicular to each other. Therefore, the effects of phase retardation caused by spontaneous birefringence occurring in the two electro-optic materials 21 and 22 can be canceled by each other at all times in spite of variations in the environmental temperature. Another feature of the voltage detector 37 is that a predetermined voltage $V_B$ is applied to the transparent electrode 41 so as to cause a given change in the refractive index of the electro-optic material 21. This allows the operating point of the detector to be shifted from points P1 to P2 on the curve shown in FIG. 7, thereby rejecting a dc component from the state of polarization of the output light emerging from the electro-optic material 22. If the environmental temperature changes, there occurs a corresponding change in the intensity of output light at operating point P2. In the embodiment shown in FIG. 3, voltage $V_B$ is automatically changed in accordance with temperature change and the operating point P2 is slightly shifted to compensate for the variation in the intensity of output light due to temperature change. Stated more specifically, when a certain change occurs in the environmental temperature, voltage $V_B$ is automatically changed to cause a corresponding change in the refractive index of the electro-optic material 21 so that the intensity of output light will not fluctuate with temperature.

As described above, the voltage detector 37 shown in FIG. 3 has the advantage that the phase retardation caused by the spontaneous birefringence occurring in the electro-optic material 22 can be canceled at all times by the electro-optic material 21. In addition, the variable voltage $V_B$ applied to the transparent electrode 41 enables the operating point of the detector to be set in such a way as to reject a dc component from the intensity of output light, while compensating for the detector at all times of its operation in such a way that the intensity of output light from which a dc component has been eliminated will not fluctuate in the face of temperature change.

Figure 4:
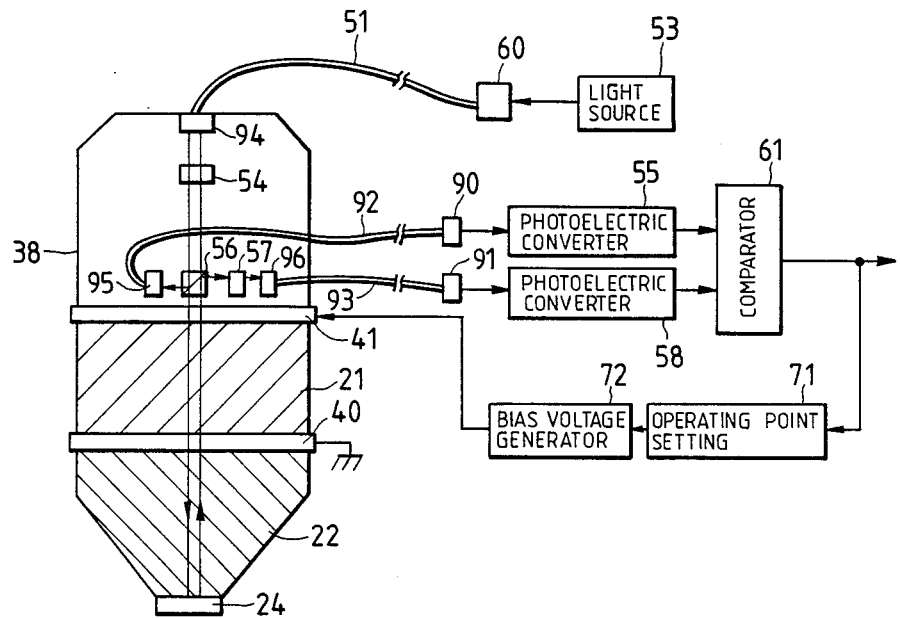
FIG. 4 is a diagram showing the composition of a complete system employing the voltage detector shown in FIG. 3.

FIG. 4 is a diagram showing the composition of a complete system employing the voltage detector 37 shown in FIG. 3.

In the system shown in FIG. 3, an electrical signal from the comparator circuit 61 is supplied to an operating point setting circuit 71. Any change in the electrical signal output produced from the comparator circuit 61 on account of a temperature change is detected by the operating point setting circuit 71, and then a bias voltage generator circuit 72 will supply the transparent electrode 41 with a voltage that cancels the detected change. If the intensity of output light contains a superposed dc component, the operating point is reset by allowing the bias voltage generator circuit 72 to supply the transparent electrode 41 with a voltage that will reject such dc component. By performing this feedback control, it is possible to attain output light whose intensity is free from a dc component and will not fluctuate in the face of temperature changes.

Figure 5:
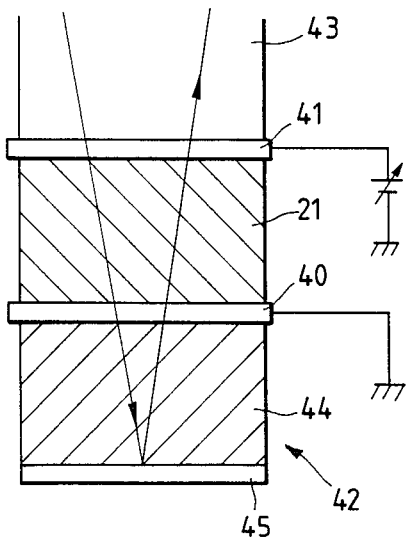
FIG. 5 is a diagram showing part of the composition of a voltage detector according to a modification of the concept shown in FIGS. 3 and 4.

FIG. 5 is a diagram showing a modification of the voltage detector depicted in FIGS. 3 and 4. In this modification, an electro-optic material 44 which takes on the same cylindrical form as the electro-optic material 21 is used in place of the frustoconical electro-optic material 22 shown in FIGS. 3 and 4, and the tip of this electro-optic material 44 is provided with a reflecting mirror 45 in the form of a thin metal film or a multilayered dielectric film. With the arrangement shown in FIG. 5, input light is completely reflected from the reflecting mirror 45 so as to produce output light whose intensity is substantially the same as that of the input light. If the input light is allowed to travel on a different optical path than the output light as shown in FIG. 5, the latter can be picked up without employing a beam splitter.

In the embodiments shown in FIGS. 3 to 5, the two electro-optic materials are arranged in such a way that their optic axes are perpendicular to each other as in the embodiment shown in FIG. 1. If desired, a λ/2 plate may be disposed between these two electro-optic materials as in the case shown in FIG. 2, with their optic axes being disposed parallel to each other.

When a streak camera is used as the detector, it is sometimes the case that the reference light is not used.

In practical applications, it is recommended that each of the optical probes 2, 31, 38 and 43 used in the above-described embodiments is provided with black coating on an inner surface of a light-splitting and extracting part and outer surfaces of the electro-optic materials in order to prevent scattering of an incident light beam.

As described on the foregoing pages, a first electro-optic material that is subject to the voltage developing in a selected area of an object to be measured is used in the voltage detector of the present invention in combination with a second electro-optic material specifically intended to compensate for the phase retardation occurring on account of spontaneous birefringence. This eliminates the need to perform any cumbersome preadjustments for the purpose of compensating for unwanted phase retardation. In addition, the phase retardation caused by spontaneous birefringence can be effectively compensated at all times in spite of changes in the environmental temperature and this allows for precise detection of the voltage on the object of interest. In accordance with another aspect of the present invention, a first transparent electrode is provided between the first and second electro-optic materials, and a second transparent electrode is formed on the side of the second electro-optic material which is opposite to the side where the first transparent electrode is disposed. If the intensity of output light contains a dc component, it can be eliminated by applying a certain voltage to the second transparent electrode. If a variable voltage is applied, the output light which has been freed of its dc component can be compensated in such a way that its intensity will not vary with temperature, thereby enabling the voltage on the object of interest to be detected with high precision and sensitivity.

What is claimed is:

1. A voltage detector for detecting a voltage developing in a selected area of an object to be measured, comprising:
    a light source for emitting a light beam;
    a voltage-sensing part including a reflection means for reflecting an input light beam, a first electro-optic material whose refractive index changes according to said voltage developing in said selected area of said object, and a second electro-optic material whose refractive index is not affected by said voltage of said object, wherein said first and second electro-optic materials are made of the same material, and are disposed in such a manner that said first and second electro-optic materials are aligned along a light-traveling direction with their lengths in said light-traveling direction being substantially identical;
    splitting and extracting means for extracting a light beam with a first predetermined polarized component from a light beam introduced from said light source which is launched into said second electro-optic material as said input light beam, and extracting an output light beam with a second predetermined polarized component from an output light beam emerging from said second electro-optic material after reflecting from said reflection means; and
    detection means for determining said voltage developing in said selected area of said object on the basis of intensity of said output light beam with said second predetermined polarized component.

2. A voltage detector as claimed in claim 1, wherein said splitting and extracting means further splits said light beam with said first predetermined polarized component into a reference light beam and said input light beam which is launched into said second electro-optic material; and said detection means determines said voltage on the basis of intensity of said reference light beam and intensity of said output light beam with said second predetermined polarized component.

3. A voltage detector as claimed in claim 1, wherein said first and second electro-optic materials are aligned in such a manner that optic axes of said first and second electro-optic materials are perpendicular to each other.

4. A voltage detector as claimed in claim 1, further comprising:
an optical means for rotating a polarizing direction of light by 90 degrees which is disposed between said first and second electro-optic materials, wherein
said first and second electro-optic materials are aligned in such a manner that optic axes of said first and second electro-optic materials are parallel to each other.

5. An voltage detector as claimed in claim 4, wherein said optical means for rotating said polarizing direction is a $\lambda/2$ plate.

6. An voltage detector as claimed in claim 1, wherein said voltage-sensing part further includes an electrode which surrounds said second electro-optic material and is connected to a ground potential.

7. A voltage detector as claimed in claim 1, further comprising:
a first transparent electrode disposed between said first and second electro-optic materials; and
a second transparent electrode disposed on a side of said second electro-optic material which is opposite to a side where said first transparent electrode is disposed.

8. A voltage detector as claimed in claim 7, wherein said first transparent electrode is connected to a ground potential, and said second transparent electrode is supplied with a voltage so that a dc component of said second predetermined polarization component of said output light can be eliminated.

9. A voltage detector as claimed in claim 7, wherein said first transparent electrode is connected to a ground potential, and said second transparent electrode is supplied with a variable voltage so that a dc component of said second predetermined polarization component of said output light can be eliminated with following a change of said dc component caused by a temperature variation.

10. A voltage detector as claimed in claim 7, wherein said first and second electro-optic materials are aligned in such a manner that optic axes of said first and second electro-optic materials are perpendicular to each other.

11. A voltage detector as claimed in claim 7, further comprising:
an optical means for rotating an polarizing direction of light by 90 degrees which is disposed between said first and second electro-optic materials, wherein
said first and second electro-optic materials are aligned in such a manner that optic axes of said first and second electro-optic materials are parallel to each other.

12. A voltage detector as claimed in claim 7, wherein said reflection means, first and second transparent electrodes are disposed in such a manner that all of those are perpendicular to said light-traveling direction and those are parallel to one another.

13. A voltage detector as claimed in claim 1, wherein an inner surface of said splitting and extracting means and outer surfaces of said first and second electro-optic materials are provided with black coating.

* * * * *